(12) United States Patent
De Souza et al.

(10) Patent No.: US 10,134,601 B2
(45) Date of Patent: Nov. 20, 2018

(54) ZINC OXIDE-BASED MASK FOR SELECTIVE REACTIVE ION ETCHING

(71) Applicant: International Business Machines Corporation, Armonk, NY (US)

(72) Inventors: Joel P. De Souza, Putnam Valley, NY (US); Yun Seog Lee, White Plains, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/480,224

(22) Filed: Apr. 5, 2017

(65) Prior Publication Data
US 2018/0294163 A1 Oct. 11, 2018

(51) Int. Cl.
*H01L 21/3065* (2006.01)
*H01L 21/308* (2006.01)
*H01L 21/02* (2006.01)

(52) U.S. Cl.
CPC ...... *H01L 21/3065* (2013.01); *H01L 21/0228* (2013.01); *H01L 21/02164* (2013.01); *H01L 21/02175* (2013.01); *H01L 21/02266* (2013.01); *H01L 21/3081* (2013.01)

(58) Field of Classification Search
CPC .................................................. H01L 21/3065
USPC .......................................................... 438/694
See application file for complete search history.

(56) References Cited

U.S. PATENT DOCUMENTS 8,222,076 B2 * 7/2012 Wu ...................... H01L 29/7869
257/E21.411

* cited by examiner

*Primary Examiner* — Roberts P Culbert
(74) *Attorney, Agent, or Firm* — Patterson + Sheridan, LLP

(57) ABSTRACT

Embodiments herein describe techniques for forming a zinc oxide mask used when performing RIE. In one embodiment, the zinc oxide mask is near-amorphous which means the zinc oxide has a grain size that is less than 50 nanometers. In contrast, metal masks such as aluminum, chromium, and titanium have a less robustness to RIE process. When performing RIE, the edges of these RIE masks can form pits or holes which harm the features of the underlying substrate. However, a near-amorphous zinc oxide RIE mask is less susceptible to pitting, and thus, can improve the geometry of the etched features.

15 Claims, 5 Drawing Sheets

SEMICONDUCTOR WAFER 135

| NEAR-AMORPHOUS ZnO | 405 |
| SiO₂ LAYER | 410 |
| SUBSTRATE | 130 |

ZINC OXIDE-BASED MASK FOR SELECTIVE REACTIVE ION ETCHING

BACKGROUND

The present invention relates to reactive ion etching (RIE), and more specifically, to using a near-amorphous zinc oxide mask when performing RIE.

RIE is an etching technology used in microfabrication. Unlike wet etching, RIE uses chemically reactive plasma to remove material deposited on wafers. The plasma is generated in low pressure (vacuum) by an electromagnetic field. High-energy ions from the plasma attack the wafer surface and react with it, thereby removing the material.

To pattern the material, RIE masks are used to cover portions of the surface that are not to be etched. The RIE masks are generally not affected by the high-energy ions, and thus, protect the underlying wafer from being etched. In this manner, RIE only etches a selected portion of the surface. Suitable RIE mask material includes metals such as aluminum, chromium, and titanium.

SUMMARY

One embodiment of the present disclosure is a method that includes forming a zinc oxide layer on a first layer of a semiconductor wafer, wherein the zinc oxide layer has a grain size smaller than 50 nanometers, patterning the zinc oxide layer to form a zinc oxide RIE mask on the first layer, and performing RIE to selectively remove an unmasked portion of the first layer.

Another embodiment of the present disclosure is a semiconductor wafer that includes a first layer comprising silicon and a RIE mask contacting the first layer and comprising zinc oxide, wherein the zinc oxide has a grain size smaller than 50 nanometers.

Another embodiment of the present disclosure is a method that includes forming a RIE mask on a substrate using a deposition process with a temperature less than or equal to 150 degrees Celsius, wherein the RIE mask comprises near-amorphous zinc oxide and performing RIE to remove an unmasked portion of the substrate without removing the RIE mask.

BRIEF DESCRIPTION OF THE SEVERAL VIEWS OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments herein describe techniques for forming a zinc oxide mask used when performing RIE. In one embodiment, the zinc oxide mask is near-amorphous which means the zinc oxide has a grain size that is less than 50 nanometers, and in one embodiment, is less than 30 nanometers. In contrast, RIE masks that are crystalline or poly-crystalline structures have much larger grain sizes (e.g., 100 nanometers or larger) which results in rough boundary areas. Further, some metal RIE masks such as aluminum, chromium, and titanium (whether amorphous, poly crystalline, or crystalline) also experience pitting when etched. However, a near-amorphous zinc oxide RIE mask is less susceptible to pitting, and thus, can improve the geometry of the etched features.

In one embodiment, the zinc oxide mask is formed using a low-temperature deposition process—e.g., atomic layer deposition (ALD), sputtering, sol-gel, chemical vapor deposition (CVD), evaporation, and the like. By using temperatures less than, e.g., 150 degrees Celsius, the resulting zinc oxide layer is near-amorphous, unlike crystalline RIE masks or aluminum, chromium, and titanium RIE masks. The small grain size of the near-amorphous zinc oxide improves the smoothness of the pattern and pitting is avoided.

Figure 1:
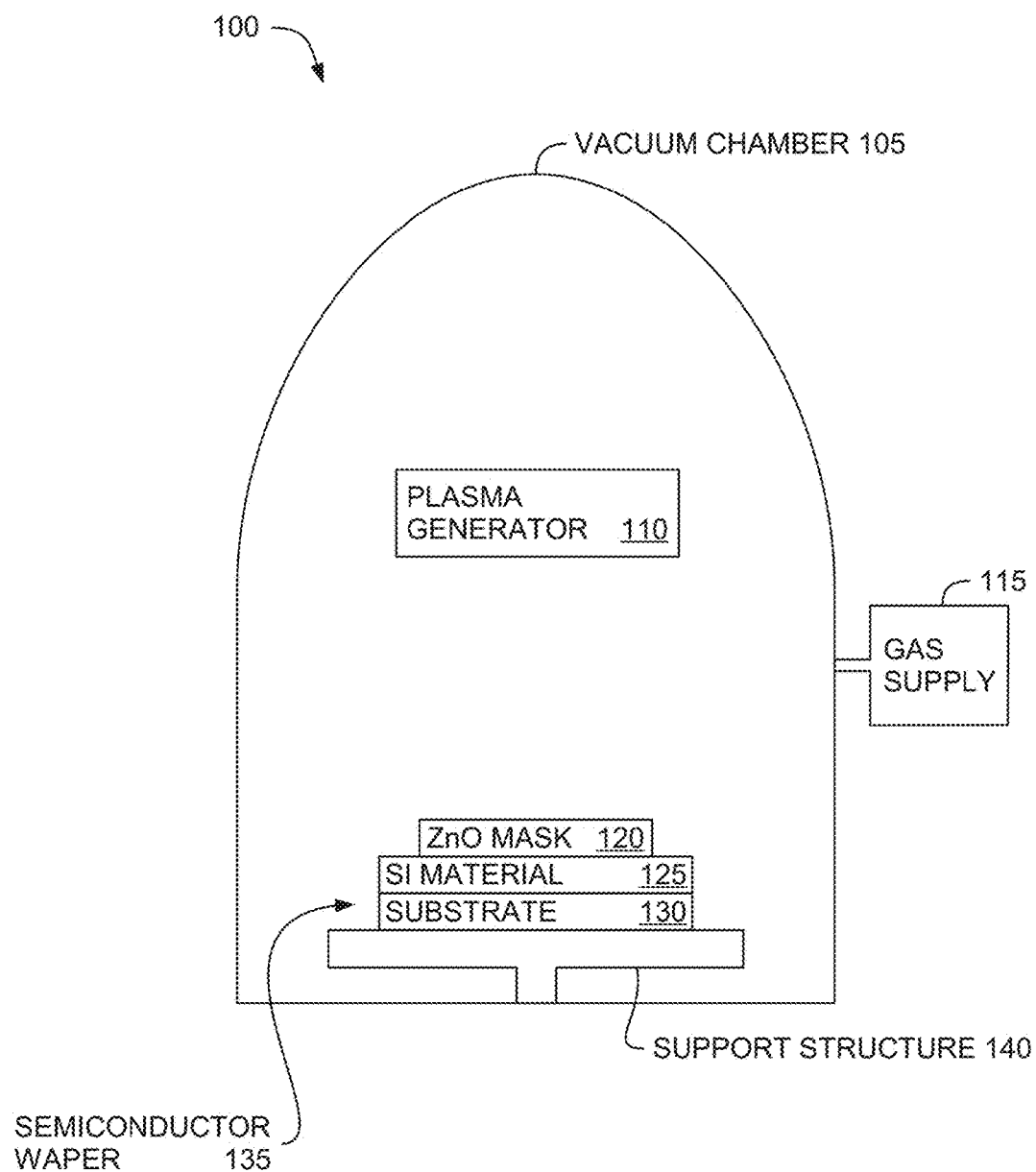
FIG. 1 illustrates a RIE system for etching a semiconductor wafer containing a zinc oxide mask, according to one embodiment described herein.

FIG. 1 illustrates a RIE system 100 for etching a semiconductor wafer using a zinc oxide mask, according to one embodiment described herein. The RIE system 100 includes a vacuum chamber 105 for providing a low pressure environment when performing RIE on a semiconductor wafer 135. The vacuum chamber 105 includes a plasma generator 110—e.g., a parallel plate plasma generator or an inductively coupled plasma generator—for generating plasma when performing RIE, a gas supply 115 for providing a gas used as a chemical etchant when performing RIE, and a support structure 140 which provides a base for the semiconductor wafer 135.

The semiconductor wafer 135 includes a substrate 130—e.g., a crystalline semiconductor—on which a silicon (Si) material 125 is disposed. In one embodiment, the substrate 130 is crystalline Si while the Si material 125 is silicon dioxide. However, the Si material 125 can be any material that contains Si which can be etched by performing RIE. Further, although FIG. 1 illustrates only one semiconductor wafer 135, the vacuum chamber 105 and support structure 140 may be able to accommodate multiple wafers.

A zinc oxide (ZnO) mask 120 is formed on the Si material 125. In one embodiment, the zinc oxide mask 120 includes only zinc and oxygen. In another embodiment, the zinc oxide mask 120 may include additional elements besides zinc and oxygen; nonetheless the grain size of the zinc oxide in the mask 120 is equal to or less than 50 nanometers and forms a near-amorphous layer. In another embodiment, the zinc oxide in the mask 120 has a grain size equal to or less than 30 nanometers. As mentioned above, other RIE masks that include crystalline or poly-crystalline structures (e.g., grain sizes equal to or greater than 100 nanometers) or RIE masks metals such as aluminum, chromium, and titanium are susceptible to rough boundary areas.

The gas supply 115 may inject different gases into the vacuum chamber 105 depending on what material of the semiconductor wafer 135 is being etched. For example, to etch ZnO to form the mask 120, the gas supply 115 may inject a gas etchant that includes chlorine or methane which etches the ZnO but not the underlying Si material 125. Conversely, when etching the Si material, the gas supply 115 may inject a fluorine containing gas (e.g. $CF_4$, $CHF_4$, $SF_6$, etc.) or a mixture of fluorine containing gas and oxygen into the vacuum chamber 105 which etches the Si material 125 but not the ZnO mask 120. In another embodiment, ZnO can be etched by liquid-based etchants (e.g. hydrochloric acid, nitric acid, etc.)

Figure 2:
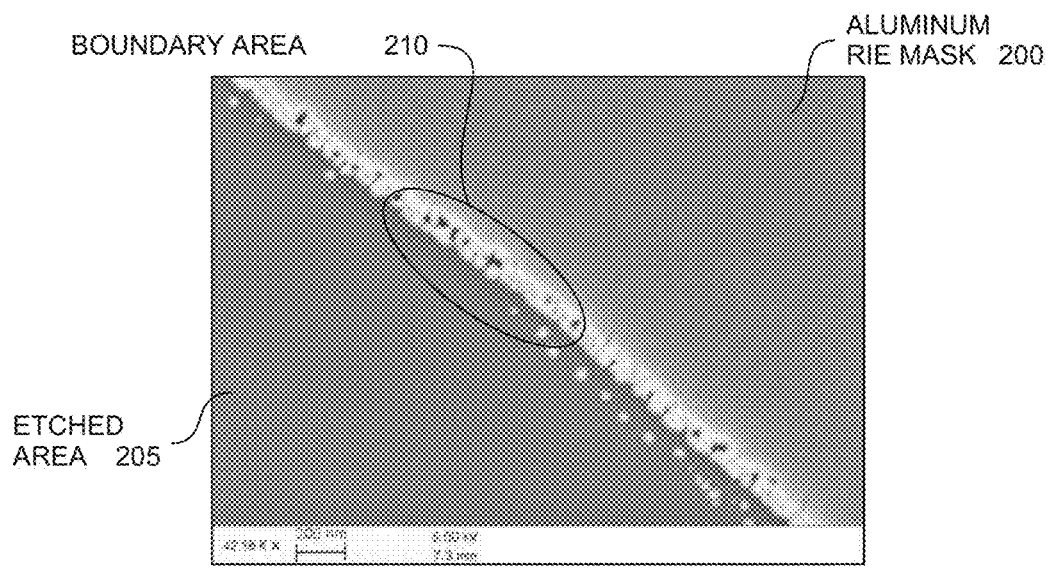
FIG. 2 illustrates the results of performing RIE at high power using an aluminum mask, according to one embodiment described herein.

FIG. 2 illustrates the results of performing RIE at high power using an aluminum RIE mask 200, according to one embodiment described herein. Specifically, FIG. 2 is a scanning electron microscope (SEM) image of a top view of a wafer that contains the aluminum RIE mask 200 and an etched area 205. In FIG. 2, the aluminum RIE mask 200 shields a portion of the underlying substrate while the uncovered portion of the wafer—i.e., the etched area 205— is etched when performing RIE. The aluminum mask 200 has a thickness of 50 nanometers. In this embodiment, the etched area 205 is silicon dioxide which was etched using plasma in the presence of a gaseous combination of $CF_4+O_2$. Moreover, the etch is a high-energy RIE process—e.g., a plasma power density of 1.25 W/cm^2. A high-energy RIE process rather than a low-energy process may be preferred since the high-energy process results in faster etching rates which can improve throughput in a fabrication process. That is, by using a high-energy RIE process, a manufacturer can increase the rate at which semiconductor chips are fabricated.

At a boundary area 210 between the aluminum mask 200 and the etched area 205, the aluminum mask 200 experiences pitting where the high-energy RIE process creates pits or holes in the mask 200. As a result, the underlying substrate is also etched at these pits. Thus, when the aluminum mask 200 is removed, there is an irregular (i.e., not sharp) boundary between the etched area 205 and the portion of the substrate underneath the mask which was not etched when performing RIE. Put differently, instead of a well-defined boundary between the etched area 205 and the portion of the substrate that was not etched, there is pitting in the boundary area 210 which harms the geometry and features of the etched and non-etched portions of the substrate. In FIG. 2, the boundary region 210 has a pit density (i.e., an edge defect density) of approximately 10 pits per every 1 micron of the boundary between the mask 200 and the etched area 205.

Figure 3:
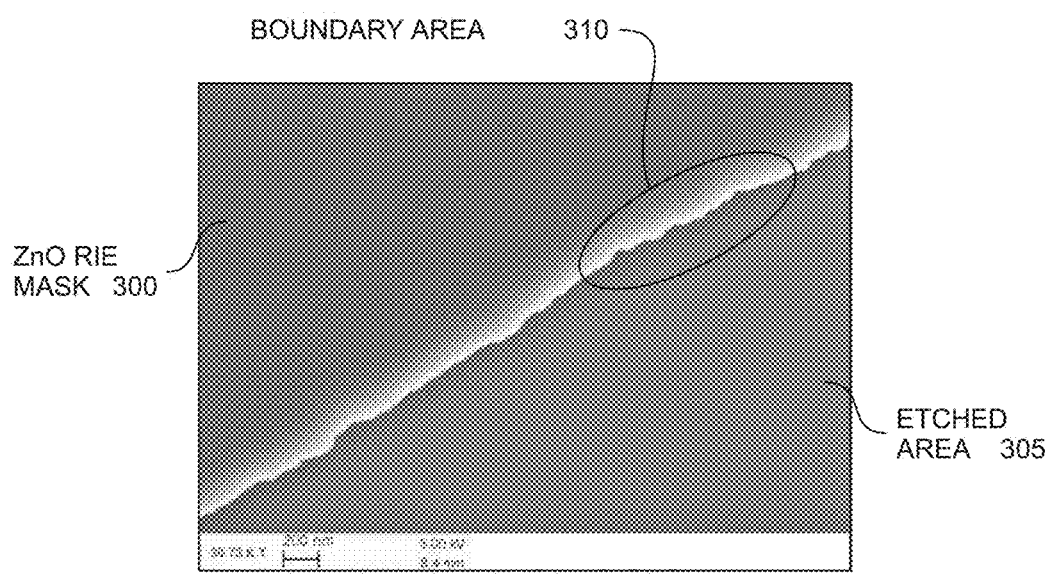
FIG. 3 illustrates the results of performing RIE at high power using a zinc oxide mask, according to one embodiment described herein.

FIG. 3 illustrates the results of performing RIE at high power using a ZnO RIE mask 300, according to one embodiment described herein. Specifically, FIG. 3 is a SEM image of a top view of a wafer that contains the ZnO RIE mask 300 and an etched area 305. Like the aluminum RIE mask in FIG. 2, the ZnO mask 300 shields a portion of the underlying substrate while the uncovered portion of the wafer—i.e., the etched area 305—is etched when performing RIE. The ZnO mask 300 has a thickness of 50 nanometers. In one embodiment, the ZnO mask 300 is a near-amorphous layer as described above. In this embodiment, the etched area 305 is silicon dioxide which was etched using plasma in the presence of a gaseous combination of $CF_4+O_2$. Moreover, the etch is a high-energy RIE process—e.g., a plasma power density of 1.25 W/cm^2.

In contrast to FIG. 2, at a boundary area 310 between the ZnO mask 300 and the etched area 305, the ZnO mask 300 does not experience pitting. As a result, the underlying substrate is protected by the ZnO mask 300 and is not etched. Instead, only the portion of the substrate not covered by the ZnO mask 300—i.e., the etched area 305—is etched.

Thus, when the ZnO mask 300 is removed, there is a relatively sharp boundary between the etched area 305 and the portion of the substrate underneath the mask 300 which was not etched when performing RIE. In FIG. 3, the boundary area 310 between the etched area 305 and the non-etched area of the substrate is better defined than the boundary area 210 in FIG. 2 and more closely resembles a straight line. Thus, the features of the etched area 305 may result in electrical devices with better performance or improved reliability when compared to using a crystalline or poly-crystalline RIE mask such as the aluminum mask 200.

The small grain size of the near-amorphous zinc oxide (i.e., less than 50 nanometers) means grain boundaries between each of the zinc oxide grains can be avoided. Grain boundaries have a higher density of structural defects than crystalline material and have a faster etching rate to the etchants. Therefore the grain boundaries results in a higher roughness on the pattern edge. However, because the near-amorphous zinc oxide can eliminate or reduce the effect of grain boundaries, the ZnO mask 300 has a lower roughness on the pattern edge after ZnO etching process, resulting in a finer mask pattern definition.

Figure 4A:
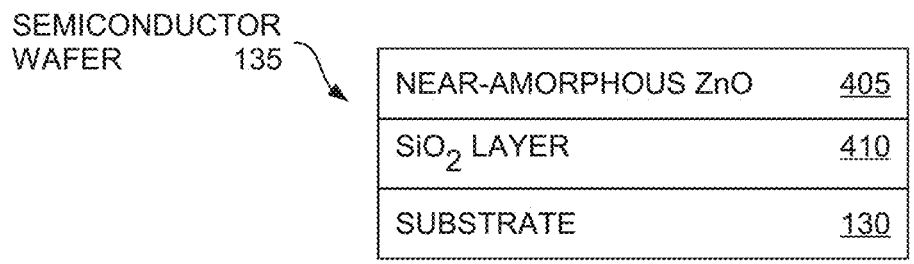
FIGS. 4A-4E illustrate forming and using a zinc oxide mask to perform RIE, according to one embodiment described herein.

FIGS. 4A-4E illustrate forming and using a zinc oxide mask to perform RIE, according to one embodiment described herein. FIG. 4A illustrates a wafer 135 having a silicon dioxide layer 410 disposed on the substrate 130. A near-amorphous ZnO layer 405 is disposed on the silicon dioxide layer 410. In one embodiment, the ZnO layer 405 includes only zinc and oxygen which is deposited onto the silicon dioxide layer 410. When deposited, the zinc and oxygen form zinc oxide which has a grain size which results in a near-amorphous layer—e.g., a grain size less than 50 nanometers. In one embodiment, the grain size of the zinc oxide is less than 30 nanometers. As described in more detail below, the near-amorphous ZnO layer 405 can be formed using a low temperature deposition process. Further, although only zinc and oxide is shown in layer 405, in other embodiments additional elements may be in the layer 405 such as trace amounts of dopants (e.g., aluminum, gallium, or boron) or other elements.

Although silicon dioxide is shown as the material in layer 410, any silicon containing material can be used. More generally, the embodiments herein can be used to etch any material as long as the material can be selectively etched using a near-amorphous ZnO mask. That is, the embodiments herein can be used so long as there is a RIE process (and etchant gas) that can etch the underlying layer 410 without also etching the ZnO layer 405.

The substrate 130 can be any material that provides support to the silicon dioxide layer 410 and the ZnO layer 405. For example, the substrate 130 can be a crystalline semiconductor or other material. In one embodiment, the substrate 130 contains a material that is not etched when etching the silicon dioxide layer 410. Put differently, when performing RIE to etch the silicon dioxide layer 410, even if the substrate 130 is exposed, the material of the substrate 130 is not etched by the RIE process although this is not a requirement.

Figure 4B:
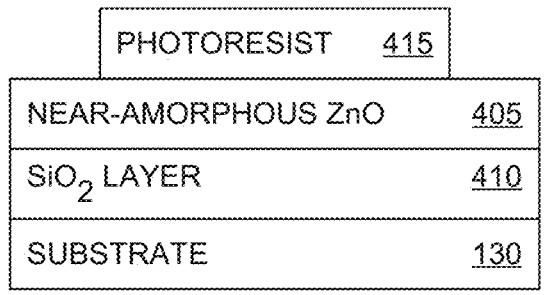

In FIG. 4B, photoresist 415 is deposited and patterned on the near-amorphous ZnO layer 405. In one embodiment, the photoresist 415 defines a pattern which is used to form a ZnO RIE mask from the ZnO layer 405. For example, the photoresist 415 can be spread evenly across the wafer and then patterned as shown in FIG. 4B into the same shape as the desired ZnO mask.

Figure 4C:
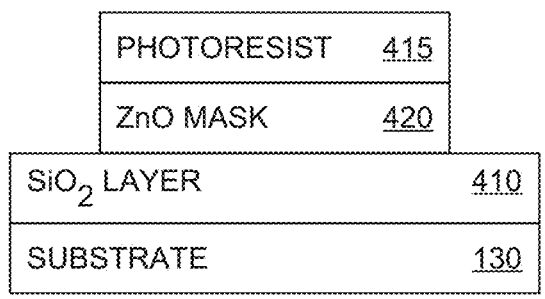

In FIG. 4C, the ZnO layer is etched to form a ZnO mask 420. In one embodiment, the mask 420 is formed by performing RIE using a gas etchant that selectively etches ZnO but not the underlying silicon dioxide layer 410. In one example, the gas etchant is a chlorine containing gas which etches ZnO but not silicon dioxide. The chlorine containing gas may include methane ($CH_4$). The etchant gas can be diluted with inert gases such as nitrogen, argon. However, instead of using a dry etch, a wet etch may be used to form the ZnO mask 420. For example, an acidic or basic aqueous solution can be used which selectively etches ZnO but not silicon dioxide. One example of a suitable aqueous solution is a 1:500 hydrochloride acid solution. As shown in FIG. 4C, the ZnO mask 420 is etched to have a similar pattern as the photoresist 415.

Figure 4D:
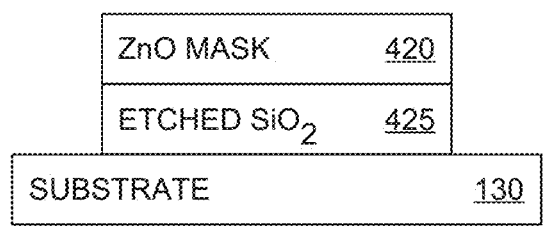

In FIG. 4D, the photoresist 415 is removed and a RIE process is used to etch the silicon dioxide layer to form an etched silicon dioxide layer 425. In one embodiment, the photoresist 415 is removed in a separate process before etching the silicon dioxide. However, in another embodiment, the photoresist 415 is removed using the same RIE process used to etch the silicon dioxide.

To etch the silicon dioxide, in one embodiment a RIE process is used with a gas etchant containing fluorine which etches silicon dioxide without etching the ZnO mask 420. Stated differently, the RIE process is highly selective in that it etches silicon dioxide but not ZnO. A non-limiting list of suitable gases that can be used to selective etch the silicon dioxide includes $CF_4$, $CHF_3$, $CH_2F_2$, and $SF_6$. Moreover, a high-energy RIE process can be implemented which uses power greater than or equal to 1 W/cm^2. In one embodiment, the high-energy RIE process may use power greater than or equal to 1.2 W/cm^2.

Figure 4E:
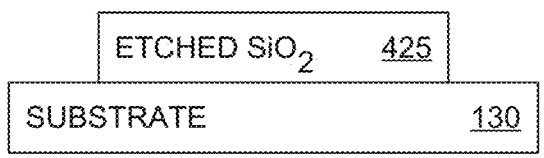

In FIG. 4E, the ZnO mask 420 is removed. The mask 420 can be removed using either dry etching or wet etching. For example, the ZnO mask 420 can be etched using a RIE process with a chlorine containing gas or using an acidic or basic aqueous solution. The etching process can be selected and controlled to remove the ZnO mask 420 without removing any (or very little) of the etched silicon dioxide layer 425 and the substrate 130.

Figure 5:
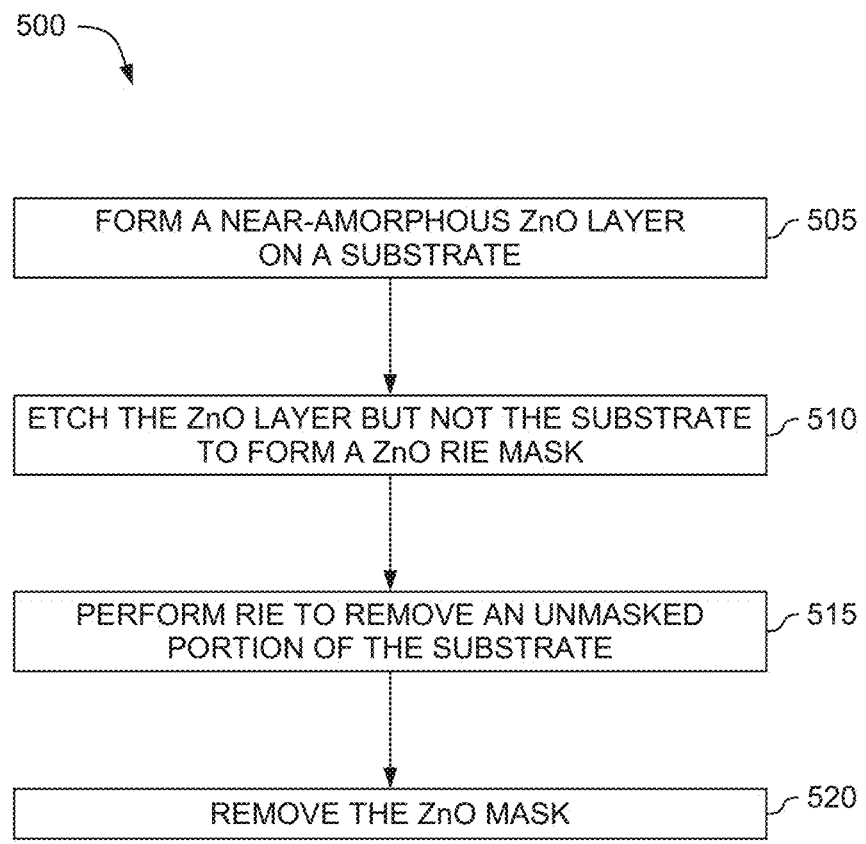
FIG. 5 is a flowchart for forming and using a zinc oxide mask to perform RIE, according to one embodiment described herein.

FIG. 5 is a flowchart of a method 500 for forming and using a ZnO mask to perform RIE, according to one embodiment described herein. At block 505, a near-amorphous ZnO layer is formed on a substrate as shown in FIG. 4A above. In one embodiment, a low temperature deposition process is used to form near-amorphous ZnO which has a grain size that is smaller than 50 nanometers, and in one embodiment, is smaller than 30 nanometers. In contrast, high temperature deposition can result in poly-crystalline or crystalline ZnO which has a much larger grain size—e.g., greater than 100 nm. A larger grain size can cause an increased pattern roughness. However, at low temperatures, the resultant ZnO is near-amorphous which eliminates or reduces the effect of grain boundaries and reduced roughness on the ZnO mask pattern edge. In one embodiment, a low-temperature deposition process uses a temperature less than 150 degrees Celsius but this temperature may vary depending on the specific process used. In another embodiment, the low-temperature deposition process uses a temperature less than 100 degrees Celsius.

The embodiments herein are not limited to any particular deposition process but can be used with any process that results in near-amorphous zinc oxide. For example, suitable deposition techniques include ALD, sputtering, sol-gel, CVD, evaporation, and the like. The temperature of these deposition techniques can be controlled to perform a low-temperature deposition process such that the deposited ZnO is near-amorphous.

At block 510, the ZnO layer is etched but not the underlying substrate to form a ZnO RIE mask. Put differently, the material on which the ZnO is directly contacting is substantially not affected by etching the ZnO layer to form the ZnO mask. The ZnO layer can be etched using either a dry or wet etch. Using FIGS. 4B and 4C as examples, the ZnO layer 405 is etched to form the ZnO mask 420. When performing this etch, portions of the ZnO layer 405 is removed but the underlying substrate (i.e., the silicon dioxide layer 410 in this example) remains substantially unaffected. In this example, the ZnO etching process is selective so as to remove the ZnO material without removing any (or very little) of the underlying silicon dioxide material.

At block 515, RIE is performed to remove an unmasked portion of the underlying substrate. Here, the RIE process is selective so as to remove the material of the underlying substrate without removing much (or any) of the ZnO RIE mask. As described above, the selectivity of the RIE process performed at block 515 is improved by forming the ZnO RIE mask from a layer of near-amorphous ZnO.

In one embodiment, the underlying substrate contains silicon—e.g., silicon dioxide or polycrystalline silicon. However, the underlying substrate can be any material that can be etched using a RIE process that does not substantially affect or etch the amorphous ZnO RIE mask. Moreover, the RIE process can etch or remove some of the ZnO mask but as long as the pits shown in FIG. 2 do not form, then the portion of the underlying substrate masked by the ZnO mask is not etched during the RIE process. As such, the RIE process can etch some of the ZnO mask but if this etching rate is slower than the etching rate of the underlying substrate, the pitting shown in FIG. 2 can be avoided.

At block 520, the ZnO mask is removed. For example, the ZnO mask can be removed using a RIE process with a chlorine containing gas or using an acidic or basic aqueous solution. In any case, removing the ZnO mask can be selective so that the underlying substrate is not affected.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements described herein, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

It is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

While the foregoing is directed to embodiments of the present invention, other and further embodiments of the invention may be devised without departing from the basic scope thereof, and the scope thereof is determined by the claims that follow.

What is claimed is:

1. A method, comprising:
    forming a zinc oxide layer on a first layer of a semiconductor wafer, wherein the zinc oxide layer has a grain size smaller than 50 nanometers;
    patterning the zinc oxide layer to form a zinc oxide reactive ion etching (RIE) mask on the first layer; and
    performing RIE to selectively remove an unmasked portion of the first layer.

2. The method of claim 1, wherein forming the zinc oxide layer comprises:
    depositing near-amorphous zinc oxide using a deposition process with a temperature less than 150 degrees Celsius.

3. The method of claim 2, wherein the grain size of the zinc oxide layer formed by the deposition process is less than or equal to 30 nanometers.

4. The method of claim 1, wherein the zinc oxide RIE mask consists only of zinc oxide.

5. The method of claim 1, wherein the first layer comprises a silicon material.

6. The method of claim 5, wherein the first layer comprises one of silicon dioxide and silicon nitride.

7. The method of claim 5, wherein performing RIE to remove the unmasked portion of the first layer comprises:
    generating a plasma; and
    while generating the plasma, introducing a fluorine containing gas into a pressurized environment containing the semiconductor wafer to etch the silicon material but not the zinc oxide RIE mask.

8. A method, comprising:
    forming a RIE mask on a substrate using a deposition process with a temperature less than or equal to 150 degrees Celsius, wherein the RIE mask comprises near-amorphous zinc oxide; and
    performing RIE to remove an unmasked portion of the substrate without removing the RIE mask.

9. The method of claim 8, wherein the deposition process is one of: atomic layer deposition (ALD), sputtering, so-gel, chemical vapor deposition (CVD), evaporation.

10. The method of claim 9, wherein the grain size of the near-amorphous zinc oxide is less than 50 nanometers.

11. The method of claim 10, wherein the grain size of the near-amorphous zinc oxide is less than 30 nanometers.

12. The method of claim 9, wherein the substrate comprises a silicon material.

13. The method of claim 12, wherein the substrate comprises a silicon dioxide.

14. The method of claim 12, wherein performing RIE to remove the unmasked portion of the substrate comprises:
    generating a plasma; and
    while generating the plasma, introducing a fluorine containing gas into a pressurized environment containing the substrate to etch the silicon material but not the RIE mask.

15. The method of claim 9, wherein the RIE mask consists only of zinc oxide.

* * * * *